United States Patent [19]

Hendrix et al.

[11] Patent Number: 5,378,315
[45] Date of Patent: Jan. 3, 1995

[54] REMOVING IMAGING MEMBER LAYERS FROM A SUBSTRATE

[75] Inventors: Loren E. Hendrix, Webster; William G. Herbert, Williamson; Gary J. Maier, Webster, all of N.Y.

[73] Assignee: Xerox Corporation, Stamford, Conn.

[21] Appl. No.: 163,776

[22] Filed: Dec. 9, 1993

[51] Int. Cl.$^6$ .................... B44C 1/22; C09K 13/00
[52] U.S. Cl. ........................... 156/655; 134/3; 156/656; 156/659.1; 156/637; 252/79.1; 252/79.4; 430/127; 430/329
[58] Field of Search ............... 156/635, 637, 639, 640, 156/642, 655, 656, 659.1, 668, 904; 134/3, 17, 28, 34, 35, 37, 38, 42; 252/79.1, 79.4, 143; 430/127, 329

[56] References Cited

U.S. PATENT DOCUMENTS

| | | | |
|---|---|---|---|
| 3,460,296 | 8/1969 | Dittmar | 51/320 |
| 3,773,579 | 11/1973 | Michelson et al. | 156/665 |
| 4,169,068 | 9/1979 | Harita et al. | 252/143 |
| 4,501,621 | 2/1985 | Abe et al. | 134/17 |
| 5,085,732 | 2/1992 | Nakamura et al. | 156/656 |
| 5,110,494 | 5/1992 | Beck | 252/156 |
| 5,170,683 | 12/1992 | Kawada et al. | 82/1.11 |
| 5,207,838 | 5/1993 | Googin et al. | 134/42 |
| 5,215,675 | 6/1993 | Wilkins et al. | 252/100 |
| 5,236,552 | 8/1993 | Fang | 156/659.1 |

*Primary Examiner*—William Powell
*Attorney, Agent, or Firm*—Oliff & Berridge

[57] ABSTRACT

Environmentally compatible solvents are used in a method for removing coating layers from an electrostatographic imaging member substrate. The solvents include a solution containing at least one member selected from the group consisting of acetic acid, dimethyl malonate and diethyl malonate. The solution is used in a method for removing coating layers from at least part of a substrate, which involves contacting a solution having at least one member selected from the group consisting of acetic acid, dimethyl malonate and diethyl malonate, on at least part of a substrate containing an coating layer until the coating layer is effectively removed from said at least part of the substrate. The environmentally compatible solvents may be used to reclaim pigments in photoconductive coating layers and substrates of defective imaging members during the manufacturing process, or after the operational life of electrostatographic imaging members has expired.

27 Claims, No Drawings

REMOVING IMAGING MEMBER LAYERS FROM A SUBSTRATE

This invention relates to electrostatography and, in particular, to a composition and method for chemically separating coating layers from imaging member substrates.

BACKGROUND OF THE INVENTION

High speed electrostatographic copying machines use different types of imaging members. Imaging members usually comprise a substrate bearing at least one organic photoconductive coating layer.

One such imaging member is the drum type. In the manufacture of drum type imaging members, at least one organic photoconductive layer is coated on a cylindrical substrate by any of a variety techniques, e.g. dip coating, spray coating, spinner coating, bead coating, wire bar coating, blade coating, roller coating, and curtain coating. It is economically advantageous to remove a defective photoconductive coating from a substrate during the manufacturing process. The ability to remove a defective or damaged photoconductive coating from a substrate without damaging the substrate so that the substrate can be recoated lowers the manufacturing costs of imaging members.

In dip coating methods, a drum substrate is vertically maintained on its axis and then successively dipped in a chemical bath containing an organic photoconductive coating material. With each successive dipping, the substrate is vertically withdrawn from the bath at a speed that will give a desired thickness for the organic photoconductive coating layer. The process is sometimes repeated to obtain a substrate drum having a plurality of organic photoconductive coating layers. These coating techniques, however, are imprecise in that the photoconductor can be contaminated by dirt or lint, or contain handling or physical defects.

In addition, after an imaging member is manufactured and has been operating in an electrostatographic copy machine or the like, it may become physically marred, or electrically fatigued such that it loses its sensitivity to light. When this happens, the imaging member must be replaced. Because substrates are among the most expensive parts of an electrostatographic copy machine to manufacture, it is economically advantageous to reclaim the substrate instead of discarding it. It is also economically advantageous to remove a photoconductive layer, and reclaim any pigment therein by chemically decomposing or dissolving the photoconductive coating layer such that the pigment can be separated from the organic binder. The pigment can then be used in a new imaging member. Ideally, it would be advantageous to remove a photoconductive layer from a substrate using environmentally compatible solvents, and immediately thereafter, rinse and recoat the substrate using one of the above coating methods to prevent recontaminating the substrate.

Various methods have been proposed for separating photoconductive coating layers from substrates. One such method is disclosed in U.S. Pat. No. 3,460,296, to C. A. Dittmar, wherein a hard coating material is removed from a relatively soft substrate by impacting the hard coating material with plastic beads having a modulus of elasticity less than the modulus of elasticity of the relatively soft substrate. This method, however, necessarily destroys the photoconductive coating layer and occasionally damages the substrate such that neither of them can be reclaimed.

Another method is disclosed in U.S. Pat. No. 4,501,621, to Abe et al., wherein a coating layer, such as a selenium coating layer, is removed from a substrate by producing cracks in the layer, introducing a volume expansive material into the cracks, and then causing the volume expansive material to expand, thereby dislodging the coating layer from the substrate. This method, however, undesirably destroys the photoconductive coating layer, and can damage the substrate sought to be reclaimed.

U.S. Pat. No. 5,085,732, to Nakamura et al., discloses a method for removing an amorphous selenium containing photoconductive layer from an electrostatographic imaging member by treating the imaging member with an aqueous solution of sodium sulfide or sodium thiourea. These solvents, however, are flammable, explodable and liberate toxic fumes.

Other methods include cutting the photoconductive coating layer from the metallic substrate; exfoliating the coating layer by repeated heating and cooling; exfoliating the coating layer by high pressure hot water ejected from a nozzle; heating the coating layer under vacuum to vaporize it; and heating the coating layer followed by chemical treatment. Each of these known methods, however, has residual problems. For example, some of the methods evolve dust or emit harmful vapors or poisonous substances. Some of these methods use environmentally incompatible solvents. And some of these methods involve heat and solvents which undesirably damage the photoconductive layer and the underlying substrate sought to be reclaimed. Directly heating an organic photoconductor also can free hazardous chemical materials including toxic fumes.

SUMMARY OF THE INVENTION

The present invention provides a composition and method for removing coatings from imaging member substrates using environmentally compatible materials. Acetic acid, dimethyl malonate or diethyl malonate, or a combination thereof, are useful for removing coating layers from a substrate so that the substrate and/or some or all components of the coating may be reclaimed. These solvents are not hazardous to the environment, and thus can be safely disposed of by diluting and discharging into a sanitary sewer without special permits or procedures.

DETAILED DESCRIPTION OF PREFERRED EMBODIMENTS

Preferably, the above-described solvents are used in a method comprising the steps of contacting at least one member selected from the group consisting of acetic acid, dimethyl malonate and diethyl malonate to at least part of an imaging member substrate containing a coating layer until the coating layer is effectively removed from said at least part of the substrate. The composition and method of the present invention work with organic ionographic imaging members or photoreceptors.

Acetic acid, dimethyl malonate, diethyl malonate and combinations thereof effectively remove coating layers from substrates without damaging the substrates. Moreover, aqueous acetic acid in concentrations of up to 50% is effective for removing coating layers from substrates. Consequently, the use of these solvents results in a reclaimed substrate that is clean enough to recoat immediately following the stripping step and a rinsing step. The ability to immediately recoat a reclaimed substrate prevents any subsequent recontamination of the substrate by dust, fingerprints, handling defects, oils, and airborne contaminants.

Moreover, acetic acid alone has a pungent fragrance. According to a preferred embodiment of the invention, dimethyl malonate and/or diethyl malonate is added to acetic acid. This increases the boiling point of acetic acid, reduces its vapor pressure, and decreases its surface tension. As a result, the evaporation of acetic acid at room and elevated temperatures is reduced and the ability to wet the imaging member is enhanced. Because of the reduction of evaporation, the accompanying pungent fragrance of acetic acid is also reduced to tolerable levels.

The addition of dimethyl and/or diethyl malonate to acetic acid in concentrations of 2.5% or higher, preferably 2.5 to 10%, aids in the removal of coating layers from metallic substrates and allows the process to be operated at higher temperatures. Higher operating temperatures facilitate the softening of the coating layer and increase its expansion without mechanical assistance. Also, dimethyl malonate and diethyl malonate have relatively higher viscosities such that adding them to acetic acid improves the ability to wet an imaging member more efficiently without splashing. Once the coating layer is removed, a final rinse in acetic acid, and then with water, removes any dimethyl and/or diethyl malonate residue left on the substrate.

According to the present invention, the above solvents may be applied to an imaging member as either a liquid, vapor, spray or any combination thereof. An applicator member, such as a buffing wheel rotating against a substrate bearing a coating layer, may be used to apply the above solvents. The imaging member also may be dipped in a bath containing the above solvents.

The time required to remove the coating material is directly related to the temperature of the solvent. For instance, the higher the temperature, the less time is required to remove the coating material, and vice versa. The above solvents can, for example, remove a coating layer from a substrate within about 1 to 30 minutes, more preferably within about 1 to 3 minutes. The above solvents are preferably applied to a substrate bearing a coating layer at room temperature or higher, more preferably between 21° to 117° C.

The invention will be further illustrated in the following, non-limiting examples. Parts and percentages are by weight unless otherwise indicated.

EXAMPLE 1

A vapor degreaser is used with acetic acid boiling at 118° C. An imaging member drum, comprising an aluminum substrate having a photoconductive coating layer thereon, is placed in the vapor for one minute to soften and destroy the adhesion of the photoconductive coating layer. The photoconductive coating layer is then removed from the aluminum substrate by pinching and unwrapping it from the metallic substrate.

EXAMPLE 2

Concentrated (100%) acetic acid at >106° C. is sprayed for 15 seconds on an imaging member comprising an aluminum substrate bearing an organic photoconductive layer until the photoconductive coating material drops into a tray. The substrate is rinsed with acetic acid. The pigment in the photoconductive coating material is separated from the binder and reclaimed.

EXAMPLE 3

Aqueous dimethyl malonate at 100% concentration is impregnated in a buffing wheel. An imaging member comprising a metallic substrate having an organic photoconductive layer thereon, is then rotated against the buffing wheel. The buffing wheel simultaneously removes the photoconductor and cleans the aluminum substrate surface.

EXAMPLE 4

An acetic acid bath at 80% concentration is heated and maintained at about 83° C. An imaging member comprising a metallic substrate and a photoconductive coating layer is then placed in the acetic acid bath. After about one minute, the imaging member is removed from the bath to determine if the photoconductive coating layer can be removed. The photoconductive layer is removed with the use of a gloved hand.

COMPARATIVE EXAMPLES

Solvents are tested to evaluate their effectiveness in removing photoconductive coating layers from metallic substrates without leaving any trace of the photoconductive coating or solvent. In each of the tests, the substrates are rinsed at room temperature using either acetic acid, water, or a mixture thereof. The solvents are tested under the following conditions.

The solvents are placed in glass containers and heated to the reported temperatures. Once the solvents reach the desired temperatures, the process to remove photoconductive coating materials is started. Imaging members are dipped into the solvents with the use of a wire. After the reported time, the imaging members are removed from the solvent, and the wire removed. Each imaging member is placed in a container. Each substrate is then either sprayed with acetic acid using a spray bottle, or dipped in a container of acetic acid to remove any remaining solvents. Then, each substrate is rinsed by dipping it in a container of deionized water or by spraying it with deionized water.

The results of the tests are shown in Table 1 below.

TABLE 1

| SOLVENT(S) | CONCENTRATION (%) | TEMP. | TIME | RINSED @ ROOM TEMP. | RESULTS |
| --- | --- | --- | --- | --- | --- |
| Acetic Acid | 100 | 108° C. | 2 Min. | Acetic Acid/ then Water | Removed |
| Acetic Acid/ Dimethyl Malonate | 95/5 | 117° C. | 2 Min. | Acetic Acid/ then Water | Removed |
| Acetic Acid/Dimethyl Malonate | 97.5/2.5 | 113° C. | 2 Min. | Acetic Acid/ then Water | Removed |
| Water/Acetic Acid | 80/20 | 93° C. | 20 Min. | Water/Acetic Acid | Removed |
| Dimethyl Malonate | 100 | 21° C. | 5 Min. | Water | No Effect |
| Dimethyl Malonate | 100 | 21° C. | 3.5 Min. | Acetic Acid | Removed |
| Dimethyl Malonate | 100 | 88° C. | 2 Min. | Acetic Acid/ | Removed |

TABLE 1-continued

| SOLVENT(S) | CONCENTRATION (%) | TEMP. | TIME | RINSED @ ROOM TEMP. | RESULTS |
|---|---|---|---|---|---|
| | | | | then Water | |
| Water | 100 | 21° C. | >8 Hrs. | Water | Removed |
| Water | 100 | 93° C. | 30 Min. | Water | Removed |
| A-56*/Water | 20/80 | 93° C. | 15 Min. | Water | Removed |
| A-56/Water | 40/60 | 93° C. | 12 Min. | Water | Removed |
| A-56/Water | 20/80 | 21° C. | >8 Hrs. | Water | Removed |
| A-56/Water | 40/60 | 21° C. | 6 Hrs. | Water | Removed |
| Citric Acid | Saturated | 21° C. | >8 Hrs. | Water | No Effect |
| Citric Acid/Water | Saturated | 21° C. | >5 Hrs. | Water | No Effect |
| Citric Acid/Water | 40/60 | 93° C. | 30 Min. | Water | P/C Removed |
| Boric Acid/Water | Saturated | 21° C. | >8 Hrs. | Water | No Effect |
| Boric Acid/Water | Saturated | 93° C. | 4 Hrs. | Water | Removed |
| Boric Acid/Water | 40/60 | 93° C. | 4 Hrs. | Water | Removed |
| HCl** | 100 | 21° C. | <2 Min. | Water | No Effect |
| Nitric Acid** | 100 | 21° C. | 30 Min. | Water | No Effect |
| Sulfuric Acid** | 100 | 21° C. | <2 Min. | Water | No Effect |

*Manufactured by SPC Electronics ™
**The acid attacked or etched the substrate.

Table 1 shows that acetic acid alone removes coating layers within 2 minutes when heated to about 108° C. Mixtures of acetic acid (95-97.5%) and dimethyl malonate (2.5-5%) remove coating layers in 2 minutes when heated to about 113° C. to about 117° C. but without the accompanying pungent fragrance of acetic acid. Dimethyl malonate alone at 21° C. and within 5 minutes does not remove coating layers when the substrate is rinsed with water, but does remove coating layers at 21° C. and within 3.5 minutes when the substrate is rinsed with acetic acid.

The table further shows that neither hydrochloric acid, nitric acid nor sulfuric acid removes coating layers from substrates at 21° C. in less than 2 minutes (hydrochloric acid and sulfuric acid) or within 30 minutes (nitric acid), and that each undesirably etches the substrate. Citric acid mixed with water does not remove coating layers at 21° C. in 5 to 8 hours or more, but citric acid (40%) mixed with water (60%) and heated to 93° C. removes coating layers in 30 minutes. Moreover, water and mixtures of water and A-56 remove coating layers in from 12 minutes to 8 hours when rinsed with water. Finally, boric acid does not remove coating layers at 21° C., but does remove coating layers in 4 hours if heated to 93° C. and rinsed with water.

Thus, Table 1 shows that acetic acid, dimethyl malonate, or combinations thereof more effectively, more quickly and/or at lower temperatures remove photoconductive coating layers from substrates than various comparative solvents, especially when acetic acid is used to rinse the substrate. The substrates are not etched by the environmentally compatible solvents of the present invention and thus can be reclaimed and recoated for further use in new generation imaging members.

While the invention has been described with reference to particular preferred embodiments and examples, the invention is not limited thereto and other embodiments and modifications can be made by those skilled in the art without departing from the spirit and scope of the invention and claims.

What is claimed is:

1. A composition for removing a coating layer from an electrostatographic imaging member substrate, comprising:
    a solution comprising acetic acid and at least one member selected from the group consisting of dimethyl malonate and diethyl malonate.

2. The composition of claim 1, wherein the solution comprises about 90 to 97.5% acetic acid and about 2.5 to 10% dimethyl malonate.

3. The composition of claim 1, wherein the solution comprises about 90 to 97.5% acetic acid and about 2.5 to 10% diethyl malonate.

4. A method for removing a coating layer from at least part of an electrostatographic imaging member substrate, comprising contacting a solution comprising at least one member selected from the group consisting of acetic acid, dimethyl malonate and diethyl malonate, on at least part of a substrate containing a coating layer until the coating layer is removed from said at least part of the substrate.

5. The method of claim 4, wherein the solution comprises acetic acid and at least one member selected from the group consisting of dimethyl malonate and diethyl malonate.

6. The method of claim 5, wherein the solution comprises about 90 to 97.5% acetic acid and about 2.5 to 10% dimethyl malonate.

7. The method of claim 5, wherein the solution comprises about 90 to 97.5% acetic acid and about 2.5 to 10% diethyl malonate.

8. The method of claim 4, wherein the solution comprises up to 50% acetic acid.

9. The method of claim 8, wherein the solution comprises about 20% acetic acid and about 80% water.

10. The method of claim 4, wherein the solution is vaporized and then applied on the substrate.

11. The method of claim 4, wherein the solution is applied in the form of a spray.

12. The method of claim 4, wherein the solution is impregnated in an applicator member.

13. The method of claim 12, wherein the applicator member is a buffing wheel which is rotated against the substrate.

14. The method of claim 4, wherein the substrate is rinsed with acetic acid after the coating layer is removed.

15. A method for removing a coating layer from an electrostatographic imaging member substrate, comprising:
    (a) heating a solution comprising at least one member selected from the group consisting of acetic acid, dimethyl malonate and diethyl malonate, to a predetermined temperature; and (b) contacting the solution to a substrate bearing a coating layer until the coating layer is removed from the substrate.

16. The method of claim 15, wherein the solution comprises acetic acid and at least one member selected from the group consisting of dimethyl malonate and diethyl malonate.

17. The method of claim 16, wherein the solution comprises about 90 to 97.5% acetic acid and about 2.5 to 10% dimethyl malonate.

18. The method of claim 16, wherein the solution comprises about 90 to 97.5% acetic acid and about 2.5 to 10% diethyl malonate.

19. The method of claim 15, wherein the solution comprises up to 50% acetic acid.

20. The method of claim 19, wherein the solution comprises about 20% acetic acid and about 80% water.

21. The method of claim 15, wherein the solution is heated to a temperature ranging from about 21° C. to about 117° F.

22. The method of claim 15, wherein the solution is impregnated in an applicator member.

23. The method of claim 15, wherein the solution is vaporized and then applied to the substrate.

24. The method of claim 15, wherein the solution is applied in the form of a spray.

25. The method of claim 15, wherein the substrate is rinsed with acetic acid after the coating layer is removed.

26. A method for recycling an electrostatographic imaging member substrate, comprising:
   (a) contacting a solution comprising at least one member selected from the group consisting of acetic acid, dimethyl malonate and diethyl malonate, to a substrate containing a coating layer until the coating layer is removed from the substrate; then
   (b) rinsing the substrate to remove any said solution remaining on the substrate; and then
   (c) immediately coating the substrate with at least one coating layer.

27. The method of claim 26, wherein the rinsing step is carried out using acetic acid.

* * * * *